United States Patent
Hwang et al.

(10) Patent No.: US 11,362,190 B2
(45) Date of Patent: Jun. 14, 2022

(54) DEPLETION MODE HIGH ELECTRON MOBILITY FIELD EFFECT TRANSISTOR (HEMT) SEMICONDUCTOR DEVICE HAVING BERYLLIUM DOPED SCHOTTKY CONTACT LAYERS

(71) Applicant: Raytheon Company, Waltham, MA (US)

(72) Inventors: Kiuchul Hwang, Amherst, NH (US); Brian D. Schultz, Lexington, MA (US); John Logan, Lawrence, MA (US); Robert E. Leoni, Somerville, MA (US); Nicholas J. Kolias, Winchester, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/881,412

(22) Filed: May 22, 2020

(65) Prior Publication Data
US 2021/0367055 A1 Nov. 25, 2021

(51) Int. Cl.
*H01L 29/20* (2006.01)
*H01L 29/205* (2006.01)
*H01L 29/778* (2006.01)
*H01L 29/47* (2006.01)

(52) U.S. Cl.
CPC ........ *H01L 29/475* (2013.01); *H01L 29/2003* (2013.01); *H01L 29/205* (2013.01); *H01L 29/7786* (2013.01)

(58) Field of Classification Search
CPC . H01L 29/475; H01L 29/7786; H01L 29/205; H01L 29/2003
See application file for complete search history.

(56) References Cited

U.S. PATENT DOCUMENTS

| | | |
|---|---|---|
| 6,534,801 B2 | 3/2003 | Yoshida |
| 6,583,449 B2 | 6/2003 | Northrup et al. |
| 7,179,329 B2 | 2/2007 | Boone et al. |
| 7,728,356 B2 | 6/2010 | Suh et al. |
| 7,795,642 B2 | 9/2010 | Suh et al. |

(Continued)

FOREIGN PATENT DOCUMENTS

| | | |
|---|---|---|
| JP | 2000068498 | 3/2000 |
| JP | 2005235935 | 9/2005 |
| TW | 2008-45144 A | 11/2008 |

OTHER PUBLICATIONS

PCT International Search Report and Written Opinion dated Jun. 21, 2021 for International Application No. PCT/US2021/020626; 13 Pages.

(Continued)

*Primary Examiner* — Fernando L Toledo
*Assistant Examiner* — Valerie N Newton
(74) *Attorney, Agent, or Firm* — Daly, Crowley, Mofford & Durkee, LLP

(57) ABSTRACT

A semiconductor device having a substrate, a pair of Group III-Nitride layers on the substrate forming: a heterojunction with a 2 Dimensional Electron Gas (2DEG) channel in a lower one of the pair of Group III-Nitride layers, a cap beryllium doped Group III-Nitride layer on the upper one of the pair of Group III-Nitride layers; and an electrical contact in Schottky contact with a portion of the cap beryllium doped, Group III-Nitride layer.

10 Claims, 2 Drawing Sheets

(56) References Cited

U.S. PATENT DOCUMENTS

| | | | |
|---|---|---|---|
| 7,939,391 B2 | 5/2011 | Suh et al. | |
| 7,972,915 B2 | 7/2011 | Chen et al. | |
| 8,044,432 B2 | 10/2011 | Chen et al. | |
| 8,344,420 B1 | 1/2013 | Jimenez | |
| 8,470,652 B1 | 6/2013 | Brown et al. | |
| 8,519,438 B2 | 8/2013 | Mishra et al. | |
| 8,629,479 B2 | 1/2014 | Nakata et al. | |
| 8,748,244 B1 | 6/2014 | Corrion et al. | |
| 8,841,702 B2 | 9/2014 | Mishra et al. | |
| 8,895,993 B2 | 11/2014 | Kalnitsky et al. | |
| 8,933,489 B2 * | 1/2015 | Kikkawa | H01L 29/201 257/200 |
| 9,059,266 B2 | 6/2015 | Mitsunaga | |
| 9,138,456 B2 | 9/2015 | O'Connor et al. | |
| 9,196,716 B2 | 11/2015 | Mishra et al. | |
| 9,263,439 B2 | 2/2016 | Zhang | |
| 9,269,790 B2 | 2/2016 | Lee et al. | |
| 9,306,009 B2 | 4/2016 | Hallin et al. | |
| 9,419,125 B1 | 8/2016 | Schultz et al. | |
| 9,437,708 B2 | 9/2016 | Mishra et al. | |
| 9,525,413 B2 | 12/2016 | Roberts et al. | |
| 9,620,598 B2 | 4/2017 | Liu et al. | |
| 9,685,345 B2 * | 6/2017 | Green | H01L 29/812 |
| 9,911,868 B2 | 3/2018 | Tanaka | |
| 9,941,384 B2 | 4/2018 | You et al. | |
| 10,038,070 B2 | 7/2018 | Tanaka et al. | |
| 10,256,332 B1 | 4/2019 | Chen et al. | |
| 10,276,705 B2 | 4/2019 | Schultz et al. | |
| 10,644,127 B2 | 5/2020 | Moens et al. | |
| 11,101,378 B2 | 8/2021 | Hwang et al. | |
| 2002/0096692 A1 | 7/2002 | Nakamura et al. | |
| 2006/0108606 A1 | 5/2006 | Saxler et al. | |
| 2010/0258842 A1 | 10/2010 | Lidow et al. | |
| 2010/0258848 A1 | 10/2010 | Lidow et al. | |
| 2012/0193637 A1 | 8/2012 | Kalnitsky et al. | |
| 2013/0009165 A1 | 1/2013 | Park et al. | |
| 2013/0240949 A1 | 9/2013 | Yamada | |
| 2013/0242618 A1 * | 9/2013 | Yamada | H01L 29/7787 363/17 |
| 2014/0042452 A1 | 2/2014 | Pendharkar et al. | |
| 2014/0252368 A1 * | 9/2014 | Lee | H01L 29/0843 257/76 |
| 2015/0021616 A1 | 1/2015 | Lee et al. | |
| 2017/0170283 A1 | 6/2017 | Laboutin et al. | |
| 2017/0250273 A1 | 8/2017 | Schultz et al. | |
| 2017/0256407 A1 | 9/2017 | Tajiri et al. | |
| 2018/0204940 A1 | 7/2018 | Schultz et al. | |
| 2018/0308966 A1 | 10/2018 | Jacquet et al. | |
| 2019/0198654 A1 | 6/2019 | Lin et al. | |
| 2019/0371930 A1 | 12/2019 | Shrivastava et al. | |
| 2021/0050215 A1 | 2/2021 | Agata et al. | |
| 2021/0202729 A1 | 7/2021 | Torabi et al. | |
| 2021/0351288 A1 | 11/2021 | Hwang et al. | |

OTHER PUBLICATIONS

Chih-Hao Li, Yan-Cheng Jiang, Hsin-Chang Tsai, Yi-Nan Zhong, Yue-Ming Hsin, Device Characteristics of AlSaN/GaN HEMTs with p-GaN, ESC JSS Focus Issue On GaN-Based Electronics For Power, RF, and Rad-Hard Applications, ECS Journal of Solid State Science and Technology, 2017, 4 pages, pp. S3125-S3218.

R. Coffie, D. Buttari, S. Heikman, S. Keller, A. Chini, L. Shen, U.K. Mishra, p-Capped GaN—AlGaN—GaN High-Electron Mobility Transistors (HEMTs), IEEE Electronic Device Letters, vol. 23. No. 10, Oct. 2002, 3 pages, pp. 588-590.

P. Kordós, M. Marso, R. Meyer, H. Lüth, Schottky barrier height enhancement on n-$In_{0.53}Ga_{0.47}As$, American Institute of Physics, Sep. 1992, 9 pages, pp. 2347-2355.

Subramaniam Arulkumaran, Takashi Egawa, Hiroyasu Ishikawa, Studies on the Influences of i-GaN, nGaN, pGaN and InGaN Cap Layers in AlGaN/GaN High-Electron-Mobility Transistors, Japanese Journal of Applied Physics, vol. 44, No. 5A, 2005, 8 pages, pp. 2953-2960.

Yaqi Wang, GaN-Based Schottky Diode, Chapter 6, Intechopen, 2018, 20 pages.

Notification of Transmittal of the International Search Report and the Written Opinion of the ISA, or the Declaration, dated Feb. 17, 2021 for International Application No. PCT/US2020/058656; 1 Page.

International Search Report dated Feb. 17, 2021 for International Application No. PCT/US2020/058656; 5 Pages.

Written Opinion of the ISA dated Feb. 17, 2021 for International Application No. PCT/US2020/058656; 10 Pages.

Notification of Transmittal of the International Search Report and the Written Opinion of the International Searching Authority, or the Declaration, PCT/US2020/022228, dated Jun. 29, 2020, 1 page.

International Search Report, PCT/US2020/022228, dated Jun. 29, 2020, 5 pages.

Written Opinion of the International Searching Authority, PCT/US2020/022228, dated Jun. 29, 2020, 10 pages.

Taiwan IPO Search Report, with English Translation, Application No. 109108964, dated Nov. 24, 2020, 2 pages.

Amano, et al.; "P-Type Conduction in Mg-Doped GaN Treated with Low-Energy Electron Beam Irradiation (LEEBI)"; Japanese Journal of Applied Physics; vol. 28; No. 12; pp. L 2112-L 2114; Dec. 1989; 4 Pages.

Bernardini et al., "Theoretical evidence for efficient p-type doping of GaN using beryllium", INFM—Dipartimento di Scienze Fisiche, Universitá di Cagliari, via Ospedale 72, I-09124 Cagliari, Italy, TECHSO, S.p.A, Elmas (CA) Italy, Sep. 3, 2018, 3 pages, pp. 1-3.

Fujieda, et al.; Growth Characterization of Low-Temperature MOCVD GaN_Comparison between $N_2H_4$ and $NH_3$; Japanese Journal of Applied Physics; vol. 26; No. 12; pp. 2067-2071; Dec. 1987; 5 Pages.

Greco, et al.; "Review of technology for normally-off HEMTs with p-GaN gate"; Materials Science in Semiconductor Processing 78; pp. 96-106; 2018; 11 Pages.

Green; "Polarity control during molecular beam epitaxy growth of Mg-doped GaN"; American Vacuum Society; J. Vac. Sci. Technol. B; vol. 21; No. 4; JVST B—Microelectronics and Nanometer Structures; pp. 1804-1811; Jul./Aug. 2003; 8 Pages.

Hasegawa, et al.; "Current Transport, Fermi Level Pinning, and Transient Behavior of Group-III Nitride Schottky Barriers"; Journal of the Korean Physical Society; vol. 55; No. 3; pp. 1167-1179; Sep. 2009; 13 Pages.

Heikman, et al.; "Non-planar Selective Area Growth and Characterization of GaN and AlGaN"; Jpn. J. Appl. Phys.; vol. 42; Part 1; No. 10; pp. 6276-6283; Oct. 2003; 8 Pages.

Katzer, et al.; "Molecular beam epitaxy of beryllium-doped GaN buffer layers for AlGan/GaN HEMTs"; Journal of Crystal Growth 251; pp. 481-486; 2003; 6 Pages.

Latham, et al.; "Calculated properties of point defects in Be-doped GaN"; The American Physical Society; Physical Review B 67, 205206; 2003; 8 Pages.

Lee, et al.; "Compensation in Be-doped Gallium Nitride Grown Using Molecular Beam Epitaxy"; Material Research Society; vol. 892; pp. 729-733; 2006; 5 Pages.

Lyons, et al.; "First-principles theory of acceptors in nitride semiconductors"; Wiley Online Library; Phys. Status Solidi B 252; No. 5; pp. 900-908; Apr. 6, 2015; 9 Pages.

Lyons, et al.; Impact of Group-II Acceptors on the Electrical and Optical Properties of GaN; Japanese Journal of Applied Physics 52; 2013; 5 Pages.

Lyons, et al.; "Shedding light on doping of gallium nitride"; SPIE Newsroom; Jul. 19, 2012; 3 Pages.

Meneghini, et al.; Technology and Reliability of Normally-Off GaN HEMTs with p-Type Gate; MDPI; Energies 2017; vol. 10; Issue 153; Jan. 25, 2017; 15 Pages.

Roberts, et al.; Control of threshold voltage in E-mode and D-mode GaN-on-Si metal-insulator-semiconductor heterostructure field effect transistors by in-situ fluorine doping of atomic layer deposition Al2O3 gate dielectrics; Applied Physics Letters 108, 072901; 2016; 6 Pages.

Sokolich; "What is Fermi-level pinning, and how could it affect the behavior of the semiconductor?"; Oct. 3, 2018; 6 Pages.

(56) References Cited

OTHER PUBLICATIONS

Storm et al., "Proximity effects of beryllium-doped GaN buffer layers on the electronic properties of epitaxial AlGaN heterostructures", Solid State Electronics 54, 2010, pp. 1470-1473, 4 pages.
Storm, et al.; "Reduction of buffer layer conduction near plasma-assisted molecular-beam epitaxy grown GaN/AlN interfaces by beryllium doping"; Applied Physics Letters; vol. 81; No. 20; Nov. 11, 2002; 3 Pages.
Subramaniam Arulkumran, Takashi Egawa, Hiroyasu Ishikawa, Studies on the Influences of i-GaN, n-DaN, p-GaN and InGaN Cap Layers in AlGaN/GaN High-Electron-Mobility Transistors, Japanese Journal of Applied Physics, vol. 44, No. 5A. 2005, published May 10, 2005, pp. 2953-2960, 8 pages.
Van de Walle, et al.; "First-principles studies of beryllium doping of GaN"; The American Physical Society; Physical Review B; vol. 63, 245205; Jun. 8, 2001; 17 Pages.
Vaudo, et al. "Characteristics of semi-insulating, Fe-doped GaN substrates", physica status solidi (a)/vol. 200, issue 1, Oct. 9, 2003, 11 pages.
Yang, et al.; "Mg incorporation in GaN grown by plasma-assisted molecular beam epitaxy at high temperatures"; Journal of Crystal Growth 439; pp. 87-92; 2016; 11 Pages.
Yuliang, et al.; "AlGaN/GaN high electron mobility transistors with selective area grown p-GaN gates"; Journal of Semiconductors; vol. 37; No. 11; May 6, 2016; 3 Pages.
U.S. Non-Final Office Action dated Oct. 13, 2020 for U.S. Appl. No. 16/379,077; 13 Pages.
Response to U.S. Non-Final Office Action dated Oct. 13, 2020 for U.S. Appl. No. 16/379,077; Response Filed Apr. 13, 2021; 11 Pages.
U.S. Notice of Allowance dated May 11, 2021 for U.S. Appl. No. 16/379,077; 11 Pages.
Taiwan Office Action (with English Translation) dated Nov. 26, 2020 for Taiwan Application No. 109108964; 16 Pages.
Response (with English Translation) to Taiwan Office Action dated Nov. 26, 2020 for Taiwan Application No. 109108964; Response filed May 17, 2021; 16 Pages.
Taiwan Notice of Allowance (with English Translation) dated Aug. 23, 2021 for Taiwan Application No. 109108964; 4 Pages.
PCT International Preliminary Report on Patentability dated Oct. 21, 2021 for International Application No. PCT/US2020/022228; 10 Pages.
Taiwan Office Action (with English Translation) dated Sep. 7, 2021 for Taiwan Application No. 109139336; 14 Pages.
U.S. Non-Final Office Action dated Apr. 26, 2021 for U.S. Appl. No. 16/727,252; 16 Pages.
Response to U.S. Non-Final Office Action dated Apr. 26, 2021 for U.S. Appl. No. 16/727,252; Response filed Jul. 26, 2021; 6 Pages.
U.S. Final Office Action dated Sep. 21, 2021 for U.S. Appl. No. 16/727,252; 14 Pages.
RCE and Response to U.S. Final Office Action dated Sep. 21, 2021 for U.S. Appl. No. 16/727,252; RCE and Response filed Jan. 11, 2022; 9 Pages.
Birkle et al.; "Studies on Carbon as Alternative P-Type Dopant For Gallium Nitride;", MRS Internet J. Nitride Semicond. Res. 4S1, G5.6; Jan. 1999; 6 Pages.
Gamarra et al., "Optimisation of a Carbon Doped Buffer Layer for AlGaN/GaN HEMT Devices;" Journal of Crystal Growth, vol. 414; Jan. 2015; 5 Pages.
Joshi et al., "Part 11: Proposals to Independently Engineer Donor and Acceptor Trap Concentrations in GaN Buffer for Ultrahigh Breakdown AlGaN/GaN HEMTs;" IEEE Transactions on Electron Devices, vol. 66, No. 1; Jan. 2019; 8 Pages.
Li et al., "Device Characteristics of AlGaN/GaN HEMTs with [-GaN Cap Layer;" ECS Journal of Solid State Science and Technology; Jul. 30, 2019, JSS Focus Issue On GaN-Based Electronics for Power, RF, and Rad-Hard Applications; pp. S3125-S3128; 4 Pages.
Meyer et al., "High Electron Velocity Submicrometer AlN/GaN MOS-HEMTs on Freestanding GaN Substrates;" IEEE Electron Device Letters, vol. 34, No. 2; Feb. 2013; 3 Pages.
Moustakas et al., "Experimental Evidence that the Plasma-Assisted MBE Growth of Nitride Alloys is a Liquid Phase Epitaxy Process;" ECS Transactions, vol. 35, No. 6; Jan. 2011; 10 Pages.
Poblenz et al.; "Effect of carbon doping on buffer leakage in AlGaN/GaN high electron mobility transistors;" American Vacuum Society; May 24, 2004; pp. 1145-1149; 5 Pages.
Willoughby et al.; "A compensating point defect in carbon-doped GaN substrates studied with electron paramagnetic resonance spectroscopy;" Journal of Applied Physics; Dec. 18, 2017; 6 Pages.
Willoughby et al.; "Photo-EPR study of compensated defects in Be-doped GaN substrates;" Journal of Applied Physics; Feb. 15, 2019; 9 Pages.
Claim Amendments filed Feb. 8, 2022 for Singapore Application No. 11202106757R; 7 Pages.
Response (with English Translation) to Taiwan Office Action dated Sep. 7, 2021 for Taiwan Application No. 109139336; Response filed Mar. 3, 2022; 12 Pages.

\* cited by examiner

DEPLETION MODE HIGH ELECTRON MOBILITY FIELD EFFECT TRANSISTOR (HEMT) SEMICONDUCTOR DEVICE HAVING BERYLLIUM DOPED SCHOTTKY CONTACT LAYERS

TECHNICAL FIELD

This disclosure relates generally to depletion mode High Electron Mobile Field Effect Transistor (HEMT) semiconductor devices and more particularly to depletion mode HEMT semiconductor devices having Schottky contact layers.

BACKGROUND

As is known in the art, active semiconductor devices such as for example, diodes and FETs (Field Effect Transistors) based on Group III-Nitride materials, such as GaN, AlGaN, InN, AlN, and ScAlN, have recently demonstrated excellent RF/Microwave performances, which are achieved with an optimization of material, process, device, and design technologies, see for example, GaN-Based Schottky Diode by Yaqi Wang, http://dx.doi.org/10.5772/intechopen.77024, Submitted: Nov. 27, 2017 Reviewed: Apr. 5, 2018 Published: Sep. 12, 2018.

A prior attempt to increase Schottky barrier height for these semiconductor devices was to introduce a dielectric insulator, such as silicon nitride or oxide, aluminum nitride or oxide, and various other dielectric films, to form MIS (metal-insulator-semiconductor) FETs. This MIS approach has an issue with surface states between the insulator films and semiconductor. More particularly, these surface states trap carriers and cause an unstable operation of FETs.

It has been reported that a thin p-type InGaAs layer on InGaAs Schottky diodes increases the Schottky barrier height (P. Kordoš et al., Schottky barrier height enhancement on n-$In_{0.53}Ga_{0.47}As$, J. Appl. Phys. 72, 2347 (1992)). It has also been reported that 5 nm p-type GaN cap layers doped with magnesium (Mg) on AlGaN/GaN HEMTs increased transistor breakdown voltage and decreased current dispersion (Li et al., Device Characteristics of AlGaN/GaN HEMTs with p-GaN Cap Layer, ECS Journal of Solid State Science and Technology, 6 (11) S3125-S3128 (2017)). While magnesium doped p-type GaN capped devices have been reported, the use of magnesium creates a memory effect in deposition systems that puts future growths at risk for increased levels of magnesium background impurity incorporation. Magnesium doping is the only reported p-type dopant for GaN.

SUMMARY OF THE INVENTION

In accordance with the present disclosure, a semiconductor device, is provided comprising: a pair of stacked Group III-Nitride semiconductor layers, the pair of stacked Group III-Nitride semiconductor layers forming a heterojunction with a 2DEG channel being formed in a lower one of the pair of stacked Group III-Nitride layers; a source electrode disposed over an upper one of the pair of stacked Group III-Nitride layers; a drain electrode disposed over an upper one of the pair of stacked Group III-Nitride layers; a cap layer of beryllium doped Group III-Nitride material disposed on an upper one of the pair of stacked Group III-Nitride layers, such cap layer of doped Group III-Nitride material extending from an ohmic contact region of the source electrode to an ohmic contact region of the drain electrode; a gate electrode in Schottky contact with the cap layer of doped Group III-Nitride material and disposed between the source electrode and the drain electrode. Thus, the cap layer of doped Group III-Nitride layer serves also as the Schottky contact layer.

In one embodiment the cap layer of beryllium Group III-Nitride material is beryllium doped gallium nitride.

In one embodiment, a semiconductor structure is provided comprising: a substrate; a pair of Group III-Nitride layers on the substrate forming: a heterojunction with a 2-Dimensional Electron Gas (2DEG) channel in a lower one of the pair of Group III-Nitride layers; and a beryllium doped, Group III-Nitride cap layer on the upper one of the pair of Group III-Nitride layers; and an electrical contact in Schottky contact with a portion of the beryllium doped Group III-Nitride cap layer having a thickness between 1 nm and 10 nm.

In one embodiment, the doping concertation of beryllium is in a range from $1\times10^{16}/cm^3$ to $5\times10^{19}/cm^3$.

The inventors have recognized that the benefits of a slightly higher Schottky barrier, while maintaining a negative threshold voltage (depletion mode), can be achieved by keeping the beryllium doped Group III-Nitride cap layer (Be:GaN) thin because one is not trying to create an enhancement mode HEMT as described in co-pending patent application Ser. No. 16/379,077, filed Apr. 9, 2019, inventors Hwang et al. entitled "SEMICONDUCTOR STRUCTURE HAVING BOTH ENHANCEMENT MODE GROUP III-N HIGH ELECTRON MOBILITY TRANSISTORS AND DEPLETION MODE GROUP III-N HIGH ELECTRON MOBILITY TRANSISTORS", assigned to the same assignee as the present invention, herein incorporated by reference, the polarization mismatch between the barrier layer and the channel layer has no upper limit.

The inventors recognized that one does not need p-type conductivity to enhance the Schottky barrier height, but rather one needs to be able to shift the surface pinning of the Fermi level to alter the effective Schottky barrier height, as can be done with an acceptor trap state, and therefore use beryllium as a dopant for the Group III-Nitride; the use of beryllium being a more process friendly dopant to use than magnesium for Group III-Nitride growth. More particularly, in one embodiment, the beryllium having a doping concentration of $5\times10^{18}/cm^3$ was experimentally found by the inventors to increase the resistivity of the GaN from 100 Ohm-cm for undoped GaN to $2.2\times10^3$ Ohm-cm for the beryllium doped GaN.

Further, the inventors have recognized that beryllium doping in GaN by MBE is possible up to $5\times10^{19}/cm^3$ without creating additional defects and disorder in the material and eventually lead to structural degradation. Doping levels below $1\times10^{16}/cm^3$ become inefficient at shifting the band structure to realize enhanced Schottky barrier heights. Further, the vapor pressure of beryllium is such that beryllium produces no undesired background doping or chamber memory effects occur following its use for MBE growth. The inventors have experimentally found that 25 nm capping layers of $5\times10^{18}/cm^3$ beryllium doped GaN grown by MBE on certain depletion mode AlGaN/GaN HEMTs can modified the band structure to produce enhancement mode HEMTs suggesting beryllium doping can efficiently create acceptor level states in GaN.

The inventors have recognized that beryllium as used as an acceptor level dopant for GaN (Be:GaN) is stable at high temperature, for example, up to at least 900 degrees Celcius, in both growth and processing steps. The resistivity of GaN layers with beryllium dopants increases, which is different from magnesium doped GaN wherein the resistivity decreases and p-type conductivity is observed. This beryllium doped GaN provides an excellent material for increasing the effective Schottky barrier height for diodes and FETs by growing a beryllium doped Group III-Nitride cap layer 1 nm to 10 nm in thickness on top of Group III-Nitride material structures for diodes and FETs. The beryllium doped cap layer increases the Schottky barrier height. The increased barrier height provides many benefits, including: 1. reducing gate leakage current; 2. increasing breakdown voltage; and 3. enhancing the reliability of diodes and FETs. In addition, this layer is used as surface passivation to improve current dispersion in RF devices.

Still further, the inventors have recognized that the addition of the doped Group III-Nitride cap layer on the surface of the Group III-Nitride HEMT does not contribute to increasing the polarization induced charge in the 2DEG of the Group III-Nitride HEMT. The Group III-Nitride HEMT is formed from a pair of stacked Group III-Nitride layers. A lower one of the pair of stacked Group III-Nitride layers is a channel layer and an upper one of the pair of stacked Group III-Nitride layers is a barrier layer. A pair of stacked Group III-Nitride layers form a heterojunction and a polarization mismatch at the heterojunction interface results in the formation of 2DEG in the channel layer. The barrier layer can be formed by one or more Group III-Nitride layers, such that the Group III-Nitride layers in the barrier layer contribute in some way to establishing the polarization mismatch at the heterojunction. The Group III-Nitride cap layer can be one or more Group III-Nitride semiconducting layers directly in contact with the barrier layer. The materials in the Group III-Nitride cap layer do not contribute to an increase in the polarization mismatch like the Group III-Nitride materials in the barrier layer, rather the Group III-Nitride cap layer materials improve surface passivation, leakage, and dispersion.

Still further the inventors have recognized that the purpose of a thin beryllium doped Group III-Nitride cap layer on top of a depletion mode HEMT in this application is to increase the Schottky barrier height of a gate contact with the depletion mode HEMT, The thickness of beryllium doped Group III-Nitride cap layer above the barrier layer of the depletion mode HEMT should be less than one fourth the thickness of the barrier layer to maintain the charge density in the 2DEG of the depletion mode HEMT.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Figure 1:
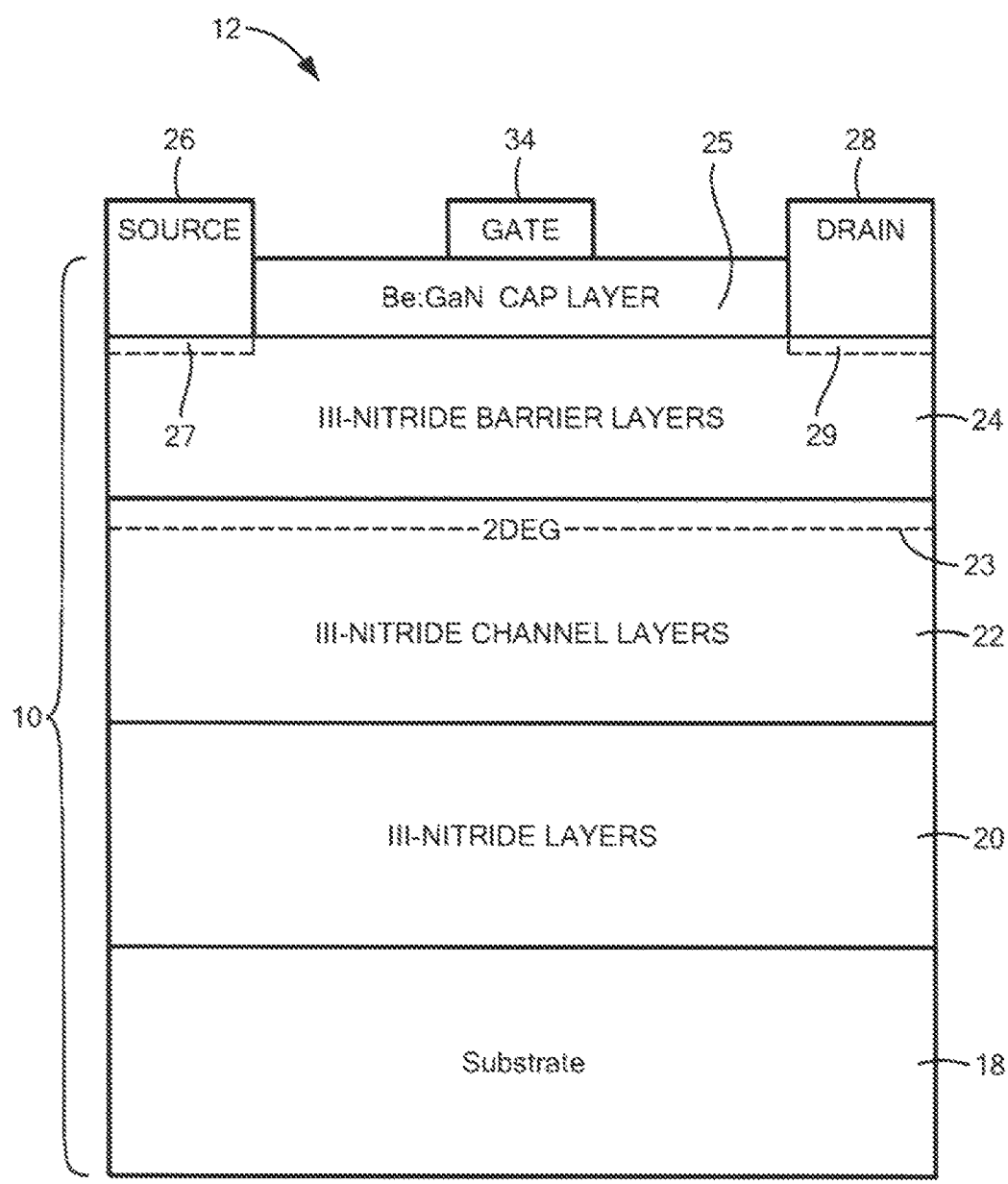
FIG. 1 is a diagrammatical sketch of a cross-section of a semiconductor device according to the disclosure.

Referring now to FIG. 1, a semiconductor structure 10 is shown having a depletion mode (D-mode) field effect transistor 12, here a D-mode HEMT. The D-mode HEMT 12 includes a source electrode 26, a drain electrode 28 and a gate electrode 34 disposed between the source electrode 26 and the drain electrode 28, as shown.

More particularly, the semiconductor structure 10 includes a single crystal substrate 18, here for example silicon carbide (SiC), and an epitaxially grown Group III-Nitride structure, here a stack of epitaxially grown Group III-Nitride structure semiconductor layers 20, 22, 24; layer 20 being one or more epitaxial grown Group III-Nitride materials forming nucleation and buffer regions of a HEMT structure, layer 22 being epitaxially grown undoped Group III-Nitride channel material with lower resistivity than the layer 20 materials, here for example GaN, and layer 24 being one or more epitaxial grown Group III-Nitride barrier materials, here for example AlGaN. The pair of stacked Group III-Nitride semiconductor layers 22 and 24 form a heterojunction with 2DEG channel (indicated by dotted line 23) in the GaN channel layer 22. A beryllium doped Group III-Nitride cap layer 25, here beryllium doped GaN cap layer 25 is formed on the AlGaN barrier layer 24. It is noted that the GaN cap layer 25 extends from an ohmic contact region 27 of the source electrode 26 to an ohmic contact region 29 of the drain electrode 28. The gate electrode 34 is in Schottky contact with the beryllium doped Group III-Nitride cap layer 25. It is also noted that the source electrode 26 and drain electrode 28 are in ohmic contact with the GaN channel layer 22. The ohmic contact regions 27 and 29 can be formed through a thermal anneal of metal contacts or through a semiconductor regrowth process and provide for an ohmic contact between the 2DEG 23 and the source and drain electrodes 26 and 28. The ohmic contact regions 27 and 29 can be achieved through various methods whereby none, part, or all of layers 25 and 24 are removed prior to their formation.

More particularly, after forming a structure having the substrate 18 and layers 20, 22, 24 in any conventional manner, the beryllium doped Group III-Nitride cap layer 25 is deposited on the surface of AlGaN barrier layer 24. Here, the Group III-Nitride material in the beryllium doped Group III-Nitride cap layer 25 is GaN. Here for example 1 nm to 10 nm of beryllium doped GaN is deposited using molecular beam epitaxy equipment, thereby depositing a single crystal, epitaxial grown Be:GaN layer; the beryllium doped Group III-Nitride cap layer 25, as shown. The thickness of the Be:GaN cap layer must be kept between 1 nm and 10 nm below the Schottky gate contact to keep the pinch-off voltage and the transconductance from significantly decreasing and impacting RF performance in microwave devices and to prevent a hole gas from forming in the Be:GaN cap layer.

It is noted that the purpose of a beryllium doped Group III-Nitride cap layer on top of a depletion mode HEMT in this application is to increase Schottky barrier height of a gate contact with the depletion mode HEMT. The thickness of beryllium doped Group III-Nitride cap layer above the barrier layer of the depletion mode HEMT should be less than one fourth the thickness of the barrier layer to maintain the charge density in the 2DEG of the depletion mode HEMT.

Here, in this embodiment, the beryllium had a doping concentration of $5 \times 10^{18}/cm^3$ in the GaN and was experimentally found by the inventors to reduce the resistivity of the GaN from 100 Ohm-cm for undoped GaN to $2.2 \times 10^3$ Ohm-cm for the beryllium doped GaN. Next the surface of cap layer 25 is masked with openings to expose portions of the Be:GaN cap layer 25 where the source and drain electrodes 26 and 28 are to be formed. A suitable etchant, here for example a chlorine based dry plasma etch, is used to etch the Be:GaN cap layer 25 and 10 nm of the AlGaN barrier layer 24. The source and drain electrodes 26, 28 are then formed in ohmic contact with the 2DEG in channel layer 22 in any conventional manner using a metal alloy and a thermal anneal. After forming the source and drain electrode 26 and 28, the gate electrode 34 is formed in Schottky contact with the Be:GaN cap layer 25, as shown.

Figure 2A:
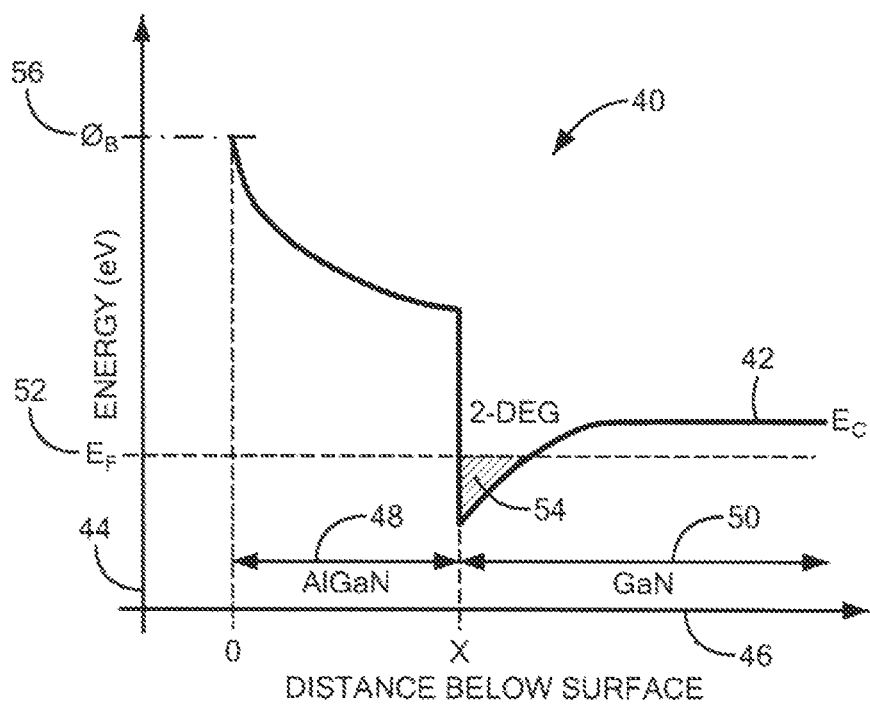
FIG. 2A is a schematic representations of the conduction band energy diagram of a semiconductor device according to the PRIOR ART.

Referring now to FIG. 2A, a band energy diagram, 40, shows an AlGaN/GaN HEMT conduction band energy curve 42, for the structure 10 where the Be:GaN cap layer 25 is 0 nm. The conduction band energy is plotted along a vertical energy axis 44, and a horizontal distance axis 46 depicting the distance below the surface of structure 10. The horizontal distance axis 46, starts at 0, which corresponds to the surface of the AlGaN Group III-Nitride barrier layer 24, and represents positions increasing deeper below the surface as it increases to the right. A position X indicates the position of the interface between the AlGaN Group III-Nitride barrier layer 24 and the GaN channel layer 22. The portion of the conduction band energy curve, 42 corresponding to the AlGaN Group III-Nitride barrier layer 24 is plotted over a barrier distance range 48 extending from 0 to X. The portion of the conduction band energy curve, 42 corresponding to the GaN channel layer 22 is plotted over a buffer distance range, 50 corresponding to distances greater than X. A dashed line 52 represents the Fermi energy and a shaded region 54 represents the 2DEG channel that is formed at the interface between the AlGaN Group III-Nitride barrier layer 24 and the GaN channel layer 22 when the conduction band energy curve, 42 dips below the dashed line 52. The effective Schottky barrier height is defined as the highest energy point of the conduction band energy curve 42 between the surface and the 2DEG, or in terms of the distances on the horizontal axis, between 0 and X. A symbol $\phi_B$ 56 represents the energy level of the effective Schottky barrier height in the band energy diagram 40.

Figure 2B:
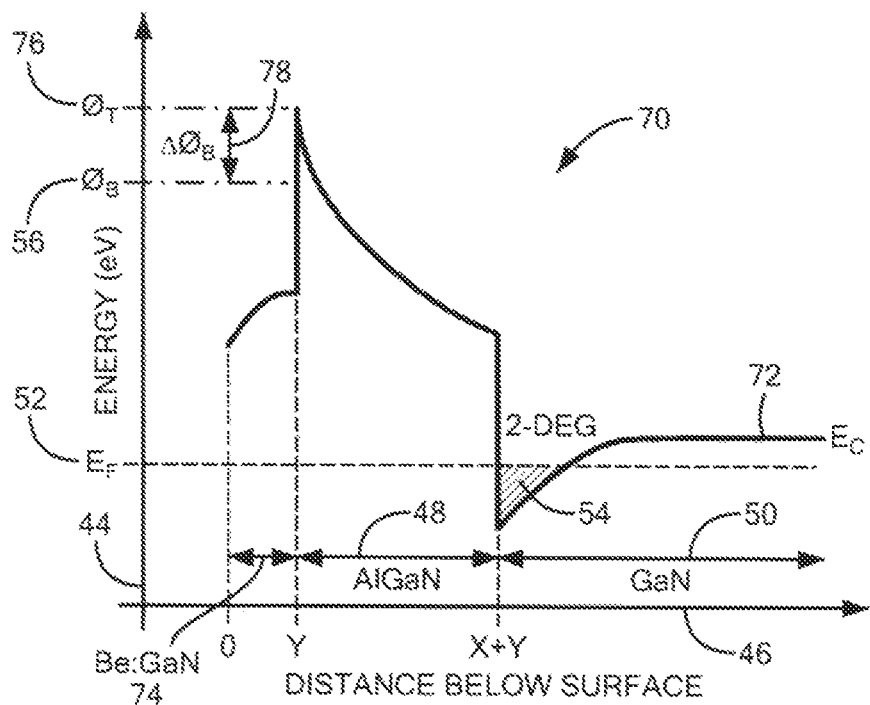
FIG. 2B is a schematic representations of the conduction band energy diagram of a semiconductor device according to the disclosure.

Referring now to FIG. 2B a second band energy diagram 70, shows a Be:GaN/AlGaN/GaN HEMT conduction band energy curve 72 for the structure 10 with the Be:GaN cap layer 25. The conduction band energy is plotted along a vertical energy axis 44, and a horizontal distance axis 46 depicting the distance below the surface of structure 10. The horizontal distance axis 46, starts at 0, which corresponds to the surface of the beryllium doped GaN cap layer 25, and represents positions increasing deeper below the surface as it increases to the right. A position Y indicates the position of the interface between the beryllium doped GaN cap layer 25 and the AlGaN Group III-Nitride barrier layer 24. A position X+Y indicates the position of the interface between the AlGaN III-Nitride barrier layer 24 and the GaN channel layer 22. The portion of the conduction band energy curve, 72 corresponding to the beryllium doped GaN cap layer 25 is plotted over a barrier cap distance range 74 extending from 0 to Y. The portion of the conduction band energy curve, 72 corresponding to the AlGaN Group III-Nitride barrier layer 24 is plotted over a barrier distance range 48 extending from Y to X+Y. The portion of the conduction band energy curve, 42 corresponding to the GaN channel layer 22 is plotted over a buffer distance range, 50 corresponding to distances greater than X+Y. The effective Schottky barrier height is defined as the highest energy point of the conduction band energy curve, 42 between the surface and the 2DEG, or in terms of the distances on the horizontal axis, between 0 and X+Y.

The acceptor level states created by the beryllium doping in the GaN cause an upward shift in the band structure and thereby increase the effective barrier height. A symbol $\phi_T$ 76 represents the energy level of the effective Schottky barrier height in the band energy diagram 70. The energy position of the effective Schottky barrier height from the structure depicted in diagram 40 is represented by the symbol $\phi_B$ 56. A symbol $\Delta\phi_B$ 78 represents the positive increase in the effective Schottky barrier height achieved with the beryllium doped GaN cap layer 25.

A number of embodiments of the disclosure have been described. Nevertheless, it will be understood that various modifications may be made without departing from the spirit and scope of the disclosure. The AlGaN barrier layer, although a common Group III-Nitride barrier layer for GaN channel layers is not the only applicable Group III-Nitride barrier material. Any combination of Group III elements bonded with nitrogen in a wurtzite or hexagonal crystal structure that produces an interface polarization mismatch with a second Group III-Nitride channel layer and the formation of a 2DEG would be applicable. Group III elements include both Group IIIA elements (B, Al, Ga, In) and Group IIIB elements (Sc, Y, La, and the Lanthanides) and all combinations thereof. The composition of the channel and barrier layers do not need to be homogeneous throughout and may consist of multiple layers, multiple combinations of Group III elements, or gradients of Group III element compositions. Additional embodiments include structures where the beryllium doped contact layer has different thicknesses across the device, for example, a uniform 10 nm thick beryllium doped cap layer is dry etched to 5 nm in thickness below the gate contact.

Further, it should be understood that other single crystal substrates 18 may be used such as free standing Group III-Nitride substrates or any crystalline substrate that enables the deposition of one or more crystalline Group III-Nitride overlayers with a single well defined crystalline orientation with respect to the substrate 18 crystal structure. This includes heterojunction structures formed via the deposition of one or more crystalline materials on another crystalline material or formed by bonding one or more layers together to define a surface region that is crystalline and supports the crystalline growth of one or more Group III-Nitride materials. Accordingly, other embodiments are within the scope of the following claims.

What is claimed is:
1. A semiconductor device, comprising:
a pair of stacked Group III-Nitride semiconductor layers, the pair of stacked Group III-Nitride semiconductor layers forming a heterojunction with a 2DEG channel being formed in a lower one of the pair of stacked Group III-Nitride layers;
a source electrode disposed over an upper one of the pair of stacked Group III-Nitride layers;
a drain electrode disposed over an upper one of the pair of stacked Group III-Nitride layers;
a cap layer of beryllium doped Group III-Nitride material disposed on an upper one of the pair of stacked Group III-Nitride layers, such cap layer of beryllium doped Group III-Nitride material extending from an ohmic contact region of the source electrode to an ohmic contact region of the drain electrode, such cap layer having a uniform thickness less than one fourth of the thickness of the upper one of the pair of stacked Group III-Nitride layers;

a gate electrode in Schottky contact with the cap layer of doped Group III-Nitride material and disposed between the source electrode and the drain electrode.

2. The semiconductor device recited in claim 1 wherein the cap layer of beryllium doped Group III-Nitride material is beryllium doped gallium nitride.

3. The semiconductor device recited in claim 1 wherein the beryllium doped Group III-Nitride material is a layer having a thickness between 1 nm and 10 nm.

4. The semiconductor device recited in claim 1 wherein the doping concentration of beryllium is in a range from $1\times10^{16}/cm^3$ to $5\times10^{19}/cm3$.

5. The semiconductor device recited in claim 2 wherein the beryllium doped Group III-Nitride material is a layer having a thickness between 1 nm and 10 nm.

6. The semiconductor device recited in claim 1 wherein the semiconductor device is a depletion mode Field Effect Transistor.

7. A semiconductor device, comprising:

a substrate;

a pair of Group III-Nitride layers on the substrate forming: a heterojunction with a 2 Dimensional Electron Gas (2DEG) channel in a lower one of the pair of Group III-Nitride layers;

a beryllium doped Group III-Nitride cap layer on an upper one of the pair of Group III-Nitride layers, such beryllium doped Group III-Nitride cap layer extending from an ohmic contact region of a source electrode to an ohmic contact region of a drain electrode, such cap layer having a uniform thickness less than one fourth of the thickness of the upper one of the pair of stacked Group III-Nitride layers; and an electrical contact in Schottky contact with a portion of the cap beryllium doped, Group III-Nitride layer.

8. The semiconductor device recited in claim 7 wherein the cap beryllium doped Group III-Nitride is a layer having a thickness between 1 nm and 10 nm.

9. The semiconductor device recited in claim 7 wherein the doping concentration of beryllium is in a range from $1\times10^{16}/cm^3$ $5\times10^{19}/cm^3$.

10. The semiconductor device recited in claim 9 wherein the cap beryllium doped Group III-Nitride is a layer having a thickness between 1 nm and 10 nm.

* * * * *